(12) United States Patent
Clayton et al.

(10) Patent No.: US 6,564,455 B2
(45) Date of Patent: May 20, 2003

(54) SOCKET TEST PROBE AND METHOD OF MAKING

(75) Inventors: Gary A. Clayton, Boise, ID (US); Douglas G. Hastings, Meridian, ID (US)

(73) Assignee: R-Tec Corporation, Meridian, ID (US)

( * ) Notice: Subject to any disclaimer, the term of this patent is extended or adjusted under 35 U.S.C. 154(b) by 283 days.

(21) Appl. No.: 09/792,855

(22) Filed: Feb. 23, 2001

(65) Prior Publication Data

US 2001/0052180 A1 Dec. 20, 2001

Related U.S. Application Data

(62) Division of application No. 09/082,291, filed on May 19, 1998, now Pat. No. 6,194,904.

(51) Int. Cl.[7] .................. H01R 43/00; H01R 43/16; H05K 3/10; G01R 31/02
(52) U.S. Cl. .................. 29/876; 29/883; 29/874; 324/755
(58) Field of Search .................. 29/593, 594, 595, 29/874, 876, 877, 881, 882, 883, 885, 848, 849, 851; 324/755, 765; 156/257; 264/272.11

(56) References Cited

U.S. PATENT DOCUMENTS

| 3,731,191 A | 5/1973 | Bullard et al. ........... 324/158 F |
| 3,906,363 A | 9/1975 | Fowler .................... 324/158 F |
| 4,460,236 A | 7/1984 | Strautz .................. 339/176 M |
| 4,547,964 A | * 10/1985 | Amano et al. ................ 29/883 |
| 4,554,506 A | 11/1985 | Faure et al. ............. 324/158 P |
| 4,846,702 A | 7/1989 | Ignasiak et al. ............... 439/71 |
| 4,952,872 A | 8/1990 | Driller et al. ............. 324/158 F |
| 4,978,912 A | 12/1990 | Vonder et al. ............. 324/158 P |
| 5,041,183 A | * 8/1991 | Nakamura et al. .......... 156/264 |
| 5,122,070 A | 6/1992 | Lebris et al. ............... 439/140 |
| 5,286,944 A | * 2/1994 | Li ........................... 219/69.15 |
| 5,436,570 A | * 7/1995 | Tan ............................ 324/761 |
| 5,635,849 A | 6/1997 | Lo et al. ..................... 324/758 |
| 5,642,056 A | 6/1997 | Nakajima et al. ........... 324/758 |

* cited by examiner

Primary Examiner—Peter Vo
Assistant Examiner—Tamra Alexander
(74) Attorney, Agent, or Firm—Robert L. Shaver; Frank J. Dykas; Stephen M. Nipper

(57) ABSTRACT

A method of making a socket test probe which results in a probe head which has flat plates which serve as electrodes encased in resin. The electrodes are conductive plates with one or more edges of the conductive plates exposed for connection to the electrodes of a socket. The entire probe head starts as a solid block of conductive material which is drilled, machined, filled with resin and machined again to form a socket testing probe utilizing the edges of conductive plates as electrodes.

8 Claims, 8 Drawing Sheets

SOCKET TEST PROBE AND METHOD OF MAKING

REFERENCE TO RELATED APPLICATION:

This application is a divisional of application Ser. No. 09/082,291, filed May 19, 1998, now U.S. Pat. No. 6,194,904. Socket Test Probe and Method of Making a Socket Test Probe. This application is filed pursuant to 35 USC §120 and 37 C.F.R. 1.53(b).

BACKGROUND OF THE INVENTION

1. Field of the Invention

The present invention generally relates to test probes for integrated circuit (IC) sockets, and more particularly to a test probe and a manner of making the test probe for insertion into integrated circuit sockets.

2. Background Information

Integrated circuits are commonly made with sockets for receiving semi-conductor chips. During the production process, these sockets are tested to be sure that all of their electrodes are connected and that they mate correctly with the electrodes of the socket to be inserted. To test the IC socket, a test probe is inserted into the socket. The test probe has electrodes which make contact with the electrodes of the socket. The electrodes of the test probe are connected to a testing device which can perform diagnostic testing of the socket and its relation to other circuitry in the IC. These sockets are typically mounted on printed circuit boards (PCB) and many such devices are connected to each other by circuitry in the PCB. An individual socket test probe is inserted into a large number of sockets to be tested during the lifetime of the test probe. These repeated insertions and removals cause wear on the electrodes of the test probe, and finding a design of a socket test probe which provides reliable connections, and durability after repeated insertions, is an ongoing problem. As the number of electrodes in these sockets has increased, the electrodes have become smaller and the spacing between them has also become closer. Therefore, the electrodes of the socket test probe must also be tightly packed together, and yet remain completely isolated from neighboring electrodes, accurately placed, small in width, and extremely durable. Achieving these goals has been difficult in prior art electrodes.

One socket test probe which attempts to resolve this problem is that of Tan, U.S. Pat. No. 5,436,570. Tan utilizes metal pins embedded in resin as the electrodes of a probe head. The sides of the probe head are machined so that the pins are partially exposed. The partially exposed sides of the pins form the electrodes of the probe head. According to Tan, the pins are to be machined so that less than fifty per-cent of their diameter is machined away. In actual practice, it is not uncommon for more than fifty per cent of a pin to be ground through. When this happens, the remaining portion of the pin is not very strongly held in the surrounding resin. After repeated uses, a pin can come loose from the resin and be peeled away from the probe head, and further use of that probe head will damage the sockets being tested.

Accordingly, it is an object of the invention to provide a socket test probe which has the capability of simulating narrow, closely spaced electrodes, but which will be durable for multiple insertions, and is not highly sensitive to machining errors during production.

A further object is a socket tester in which the electrodes do not become dislodged from the probe head and peel away from it.

Another object of the invention is to provide a process for making such a socket probe tester.

A further object of the invention is to provide a socket probe tester with the capability of renewing its electrode surfaces when they show wear.

Additional objects, advantages and novel features of the a invention will be set forth in part in the description as follows, and in part will become apparent to those skilled in the art upon examination of the following, or may be learned by practice of the invention. The objects and advantages of the invention may be realized and attained by means of the instrumentalities and combinations particularly pointed out in the appended claims.

SUMMARY OF THE INVENTION

These and other objects are attained by a socket test probe, which is designed for attachment to a socket testing device. The socket test probe is utilized in testing electrical sockets which are themselves designed to receive semi-conductor chips on an integrated circuit. The socket test probe includes a probe body, which is a generally square or rectangular piece, generally made of a conductive material. The outside walls of the probe body enclose a central opening which extends throughout its length. Inside the central opening is mounted a generally rectangular test probe. The test probe is mounted inside the probe body by a region of non-conductive resin. The test probe has four sidewalls and includes alternating layers of non-conductive resin and conductive plates, typically made of copper or other conductor. Each plate is generally rectangular and has a top edge, bottom edge, inner edge, and an outer edge. The plates are arranged along one or more sidewalls of the test probe, so that an outer edge of each conductive plate is exposed along the length of the sidewall, and serves as the electrode for the probe. The inner edge and the sides of the conductive plate are enclosed within the resin of the test probe. A bottom edge of the test probe is connected to an electrical connection, typically a copper wire attached to the conductive plate. One end of the test probe forms a four-sided test probe head, and the other end of the test probe terminates with exposed ends of the conductive plates where they attach to electrical connectors. The exposed plate edges and/or plate top edges form the electrodes along one or more sides of the probe head, or along the top of the probe head. The electrical connectors terminate in a probe interface, which is mounted to the probe body adjacent to the ends of the conductive plates.

The probe body can contain one or more positioning holes, or holes in the probe body can be mounted with a positioning pin. The positioning holes or pins in the probe body are configured to connect with matching positioning holes or pins in a testing device, which is designed to receive the test probe. The probe interface of the device typically is made from printed circuit board type material. On the probe interface are interface connection positions in which the second end of the wire is encased by solder knobs. The socket test probe described above can also have probe heads which are not perfectly rectangular in shape, but can fit any particular socket shape. The edges of the probe head can be beveled, or they can include a protrusion along the lower rim to simulate a "gull wing" or "live bug" semi-conductor chip. The probe head can also include a ridge on each of the electrodes and resin layer to simulate a "dead bug" type semi-conductor chip, which uses a "round knob" connection. The probe head can also include multiple examples of these ridges, flares and other probe head tip shapes. The purpose of multiple spaced-apart protrusions such as this is so that when electrode surfaces being utilized show signs of wear, they can be machined down to expose a new set of electrode surfaces which also have a "gull wing" or other configuration. The socket testing probe described above can also have one or more holes which pass through the conductive plates, and which is filled with resin. This makes the resin contiguous from each side of one plate to another, and aids in preventing delamination of the conducting plates from the resin.

Another aspect of the invention is the method of making the socket test probe. These steps start with a solid rectangular block of conductive metal, such as copper, and machining a recess on one end of the block. This recess leaves an outer rim around the end, and defines a moat around a rectangular tower of metal from the original solid block of metal. The next step is drilling a central hole through the tower of metal and all the way through the block to the other side. Starting from the central hole just drilled, the hole is expanded into a central channel with fluted side channels which define three sides of a number of plates. Electro-discharge machining (EDM) has been found to be highly effective for this machining, although other methods could work just as well, such as high pressure water jet cutting or plasma cutting. The central channel and fluted side channels define three sides of a number of conductive plates. At this point, the fourth side of each plate is still attached to the original block of metal which was the starting point. After the central channel has been machined by EDM, electrical connectors are attached to these ends of the conductive plates which protrude into the recess. Then the central channel and part of the recess in the block is filled with a liquid resin. During the filling, precautions are taken to remove bubbles from the resin. This can be by a vibration, by filling slowly from the bottom, or by the use of a highly viscous resin, or by use of a vacuum chamber. The recess is filled to a level even with corner bosses in the recess, covering all the conductive plates. Next, the remaining block of metal is machined on the second end of the metal block down to the resin core which is in the central channel of the block. By machining down to this resin core, a rectangular test probe is left, with the outside edges of the conductive plates exposed and forming electrodes for contact with a socket. This machining is extended slightly into the moat now filled with resin, thereby isolating the conductive plates from contact with the metal block from which they originated and leaving the metal plates encased in resin. Each has an outside edge exposed, to serve as an electrode, and is connected to the metal block by the remaining resin in the moat. The end of the block opposite the recess now forms a probe head. The next step is connecting the electrical connections to a probe interface for communication with a matching interface of a testing device. The electrical connectors are typically copper wires, and are connected to the probe interface by putting the wires through holes in the PC board, stripping the wires, pushing the wires back into the PC board, soldering the wires to the PCB, and trimming the wires, which leaves a solder knob on the outside of the PC board and the probe interface.

The method can also include the step of drilling one or more positioning holes in the rim around the recess of the metal block. The hole can be used to mount a positioning pin, or the hole can interconnect with a positioning pin from corresponding pins in a testing device designed to connect with the test probe. An optional step can include machining the probe head of the metal block to leave a protrusion on the outer edge which makes the electrodes of the probe head similar in shape to semi-conductor chips with flared electrodes. A number of these protrusions can be arranged in spaced apart positions on the test probe, so that when one becomes worn, it can be machined away and the next electrode set can be utilized. The method can also involve machining the probe head edge to form a beveled edge. The method can also involve drilling one or more holes through the metal block, so that the hole passes through the conductive metal plates. When the central channel is filled with resin, the resin passes through the holes and connects the conductive plates together with a contiguous resin rod. This contiguous resin rod helps resist delamination of the layers of the conductive plates and the resin layers.

Still other objects and advantages of the present invention will become readily apparent to those skilled in this art from the following detailed description wherein I have shown and described only the preferred embodiment of the invention, simply by way of illustration of the best mode contemplated by carrying out my invention. As will be realized, the invention is capable of modification in various obvious respects all without departing from the invention. Accordingly, the drawing and description are to be regarded as illustrative in nature, and not as restrictive.

DESCRIPTION OF THE PREFERRED EMBODIMENTS

Figure 1:
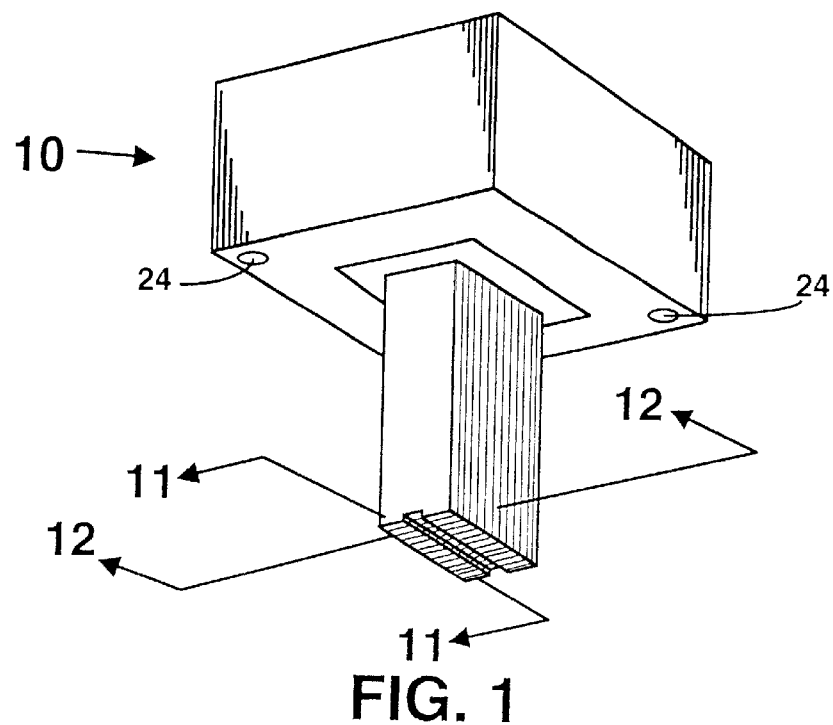
FIG. 1 is a perspective view of the socket testing probe.

Several preferred embodiments of the invention are shown in FIGS. 1 through 14. FIG. 1 is a perspective view of the device. The socket test probe of FIG. 1 is preferably made from a solid block of copper, and has a probe head with electrodes which are the exposed edges of copper plates which were originally part of the solid block of copper, but which have been machined from the solid block and isolated in resin, so that they are no longer in physical contact with other elements of the copper block. One aspect of the invention is a probe head which utilizes generally rectangular plates encased in resin, each with an exposed edge which serves as an electrode, with the rest of the plate embedded in resin. This probe can be made by a variety of methods. A preferred method is another aspect of the invention. The subsequent figures illustrate this method.

Figure 2:
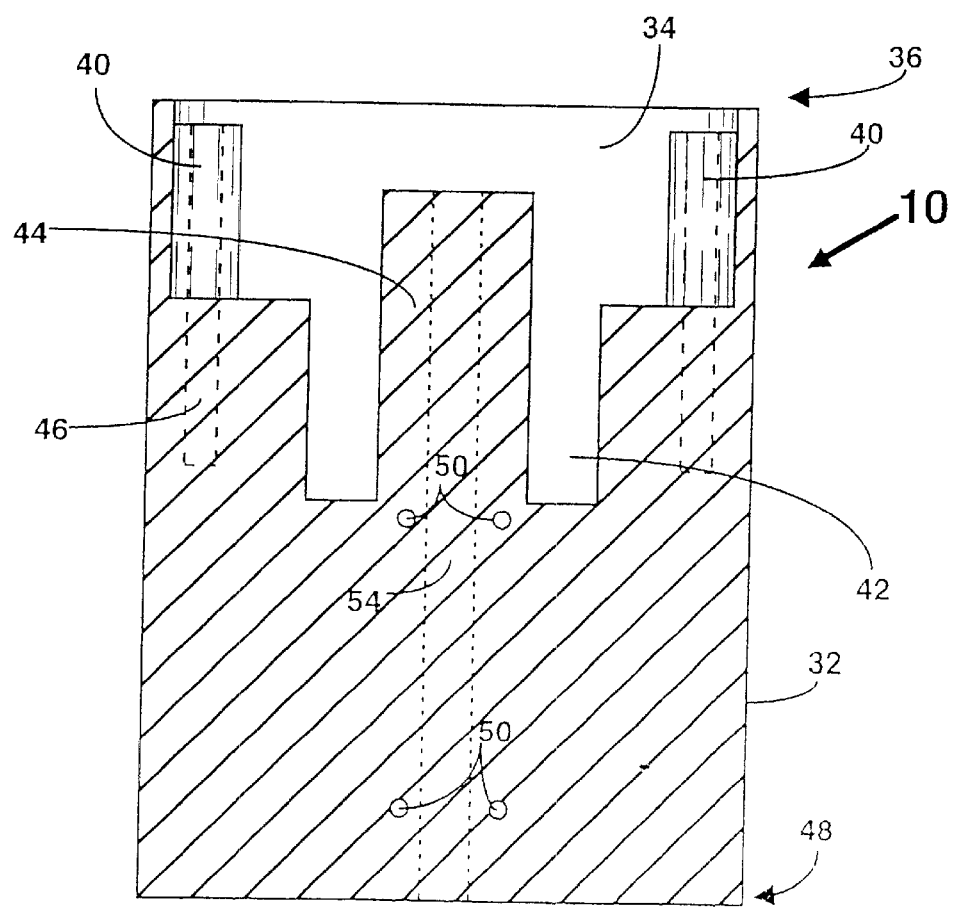
FIG. 2 is a side cross-sectional view of the metal block with a recess and various structures machined out of it.
Figure 3:
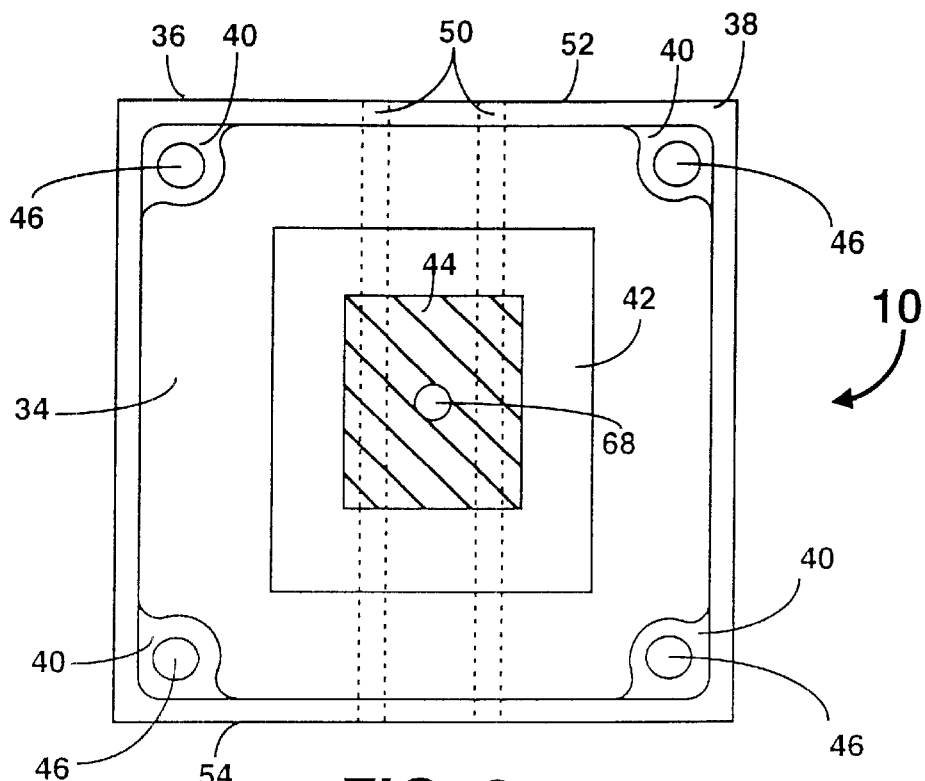
FIG. 3 is an end view of the metal block showing the recess, and the moat around the tower.

Starting with a solid block of copper 32 approximately 2"×2"×2", a recess 34 is machined into a first end 36 of the block 32. A side view of the recess 34 is shown in FIG. 2 and a view looking down into the recess is shown in FIG. 3. The recess 34 is cut so that a rim 38 is left around the first end 36, and corner bosses 40 are left for later drilling out. A moat 42 is incised into the block, leaving a tower 44 from the original material of the block of copper 32. Next, corner holes 46 are drilled to a depth approximately equal to the depth of the moat 42. A central hole 68 is drilled down the center of the tower 44 through the length of the block of copper 32 and out the second end 48 of the block of copper. Optionally, one or more reinforcing holes 50 can be drilled from the right side 52 to the left side 54 of the block of copper 32.

Figure 4:
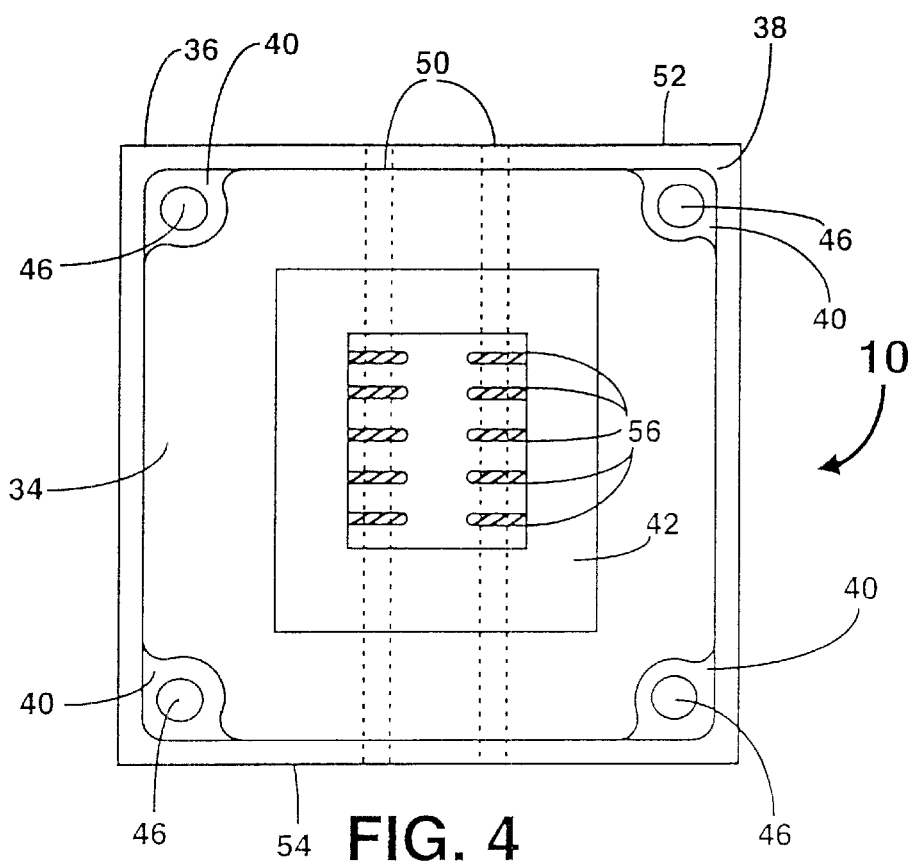
FIG. 4 is an end view of the metal block showing a central channel machined out of the metal tower.

The next step of processing involves the use of wire electro discharge machining or EDM. In wire EDM, a very fine wire is tightly stretched and electricity is passed through the wire. When the wire touches a conductive surface, the surface it touches is basically vaporized. This technique is used on the socket test probe by extending an EDM wire through central hole 68. This wire extends all the way through the block and is made taut in the central hole 68 and energized. The EDM wire then is passed through the metal of the tower 44 and block 32 to form a central channel 70 with a shape similar to that shown in FIG. 4. The fins or fluted structures in what was tower 44 are three sides of what will become the conductive plates 56 and will form the electrodes 58 of the socket test probe 10. FIG. 4 shows the conductive plates 56 after the EDM process, as seen from the first end 36 of the block 32. This type of machining results in tolerances of 0.0001 inch, and can achieve very fine spacing of electrodes and gaps between electrodes.

Figure 5:
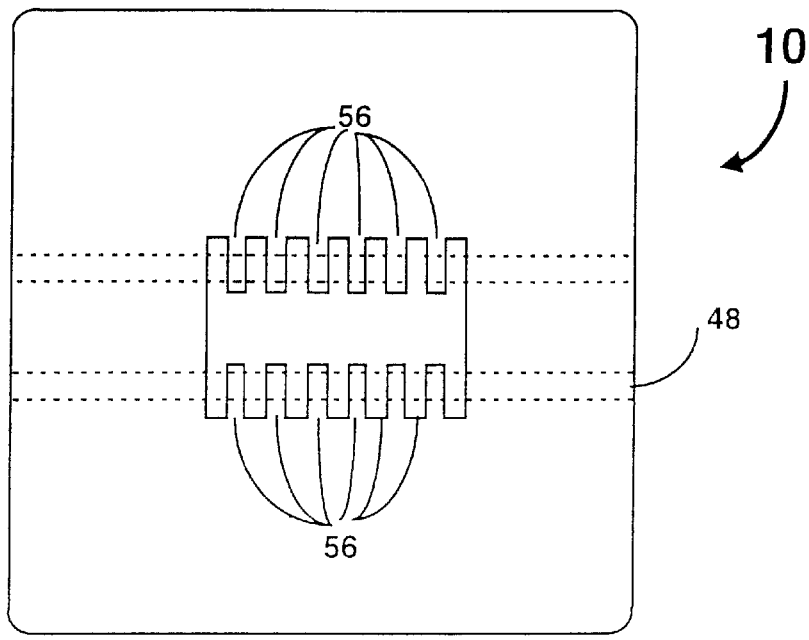
FIG. 5 is a view of the second end of the metal block showing the central channel machined out of the metal block.

FIG. 5 shows the central channel 70 from the second end 48 of the block 32.

Figure 6:
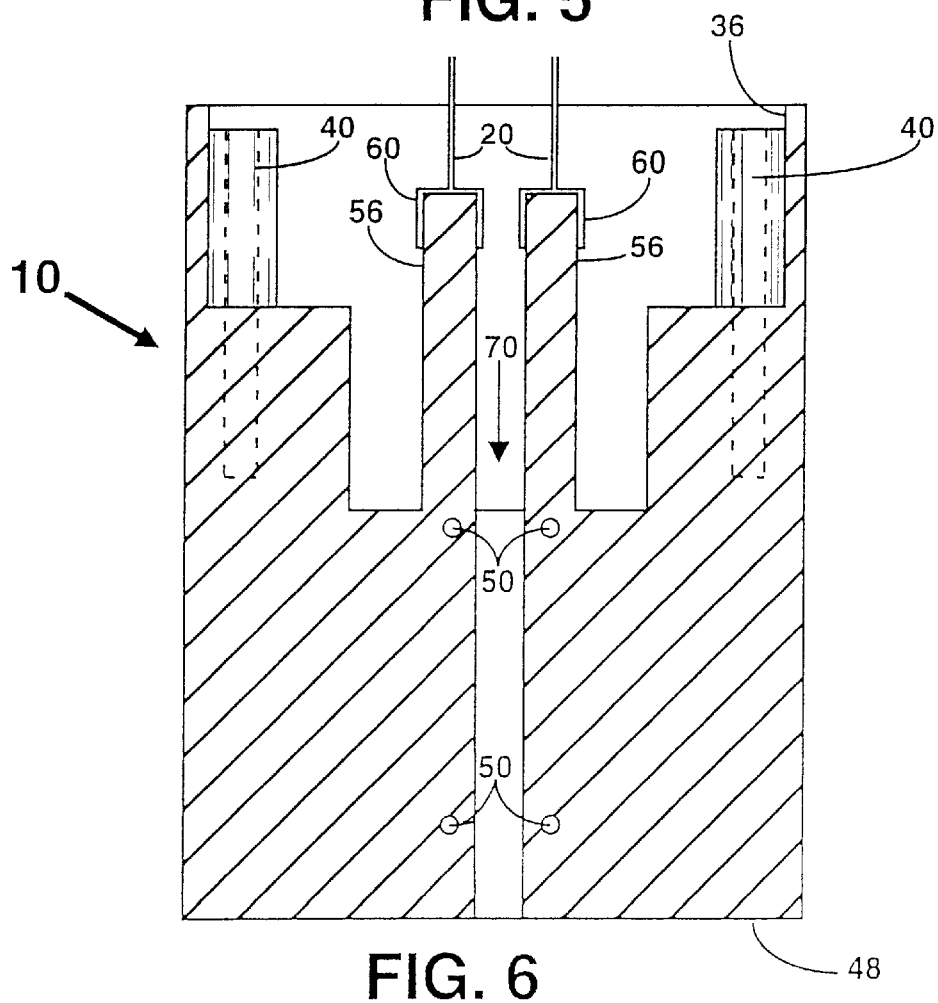
FIG. 6 is a side cross-sectional view of the metal block showing the central channel cut through the center of the block.

FIG. 6 shows a side cross-sectional view of the socket test probe after the EDM machining. Next, electrical connectors 20 are attached to the conductive plates 56 located in the region of the recess 34. These are typically copper wires and use any of a number of conventional methods of attachment to the conductive plates 56. A slip-on friction cap 60 is shown in FIG. 6.

Figure 7:
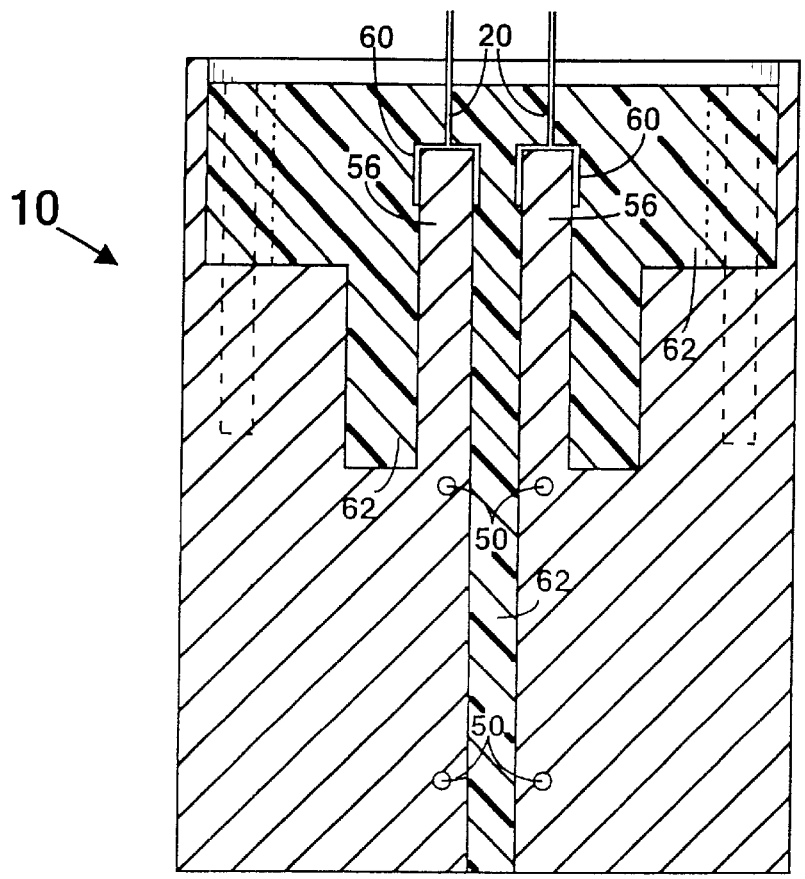
FIG. 7 is a side cross-sectional view of the metal block showing the recess partially filled with resin and the central channel filled with resin, and showing the positioning of future machining cuts.

Next, the recess 34, including the moat 42 and the central channel 70, including the regions between the conductive plates 56 is filled with a two part, high dielectric strength resin 62, as shown in FIG. 7. The resin 62 is non-conductive, and forms a machinable solid when it is fully cured. It is poured to a level even with the corner bosses. The resin 62 is poured so that there are no voids or bubbles between conductive plates 56. Techniques which aid in removing bubbles include using a highly viscous resin, filling it slowly so that voids fill from the bottom towards the top, using a vibration device to shake bubbles free as the resin 62 fills, or using a vacuum chamber to remove bubbles.

Figure 8:
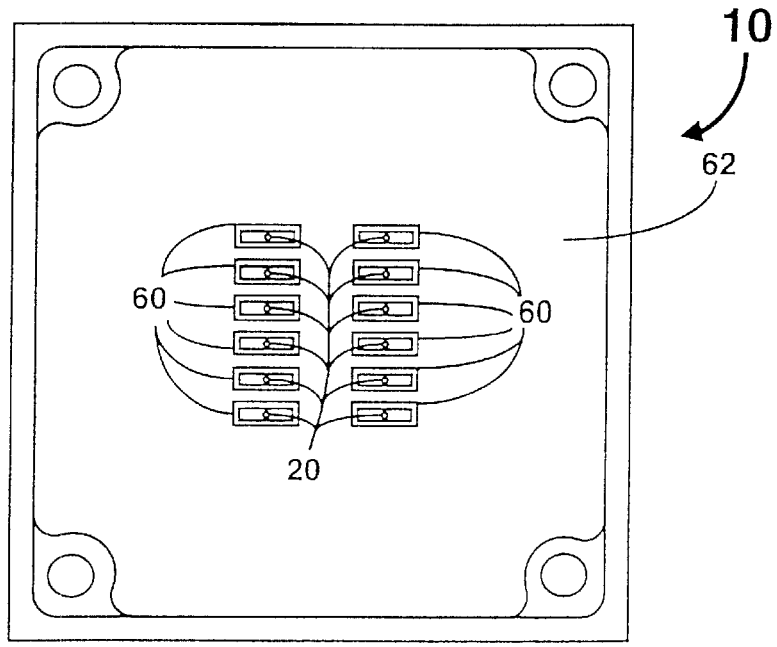
FIG. 8 is a view of the first end of the metal block, showing the conductive plates extending out of the resin and attached to electrical connectors.

FIG. 8 is a view of the recess 34 filled with resin 62, with the ends of the conductive plates 56 enclosed and with their friction caps 60 installed, thus connecting them to electrical connections 20.

Figure 9:
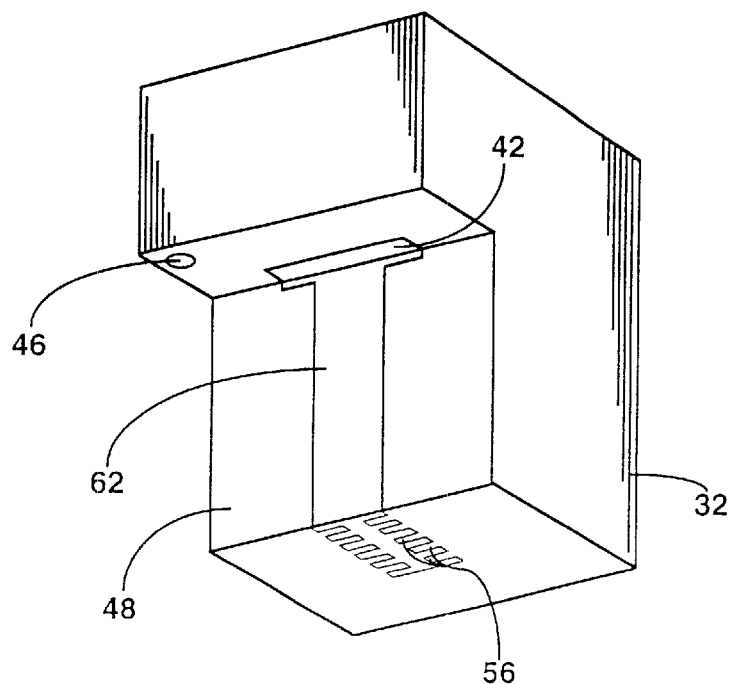
FIG. 9 is a perspective view of the metal block with a first machining cut made to shape a probe head.
Figure 10:
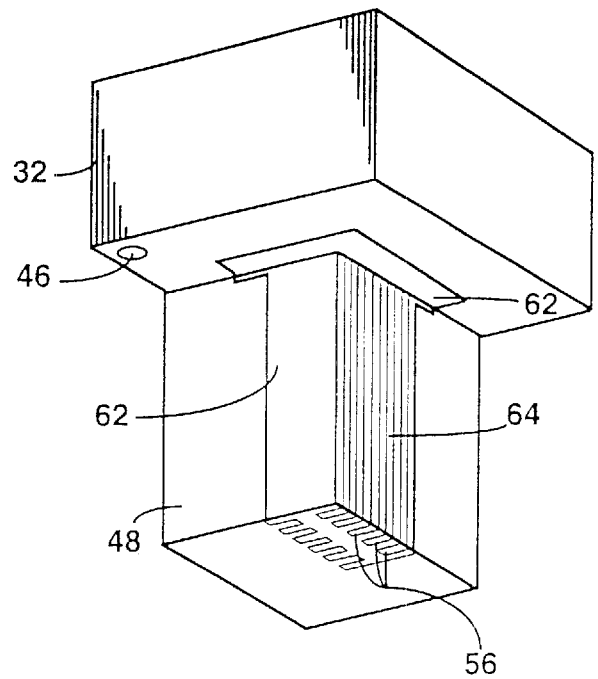
FIG. 10 is a perspective view of the metal block with a second machining cut made to form a rectangular probe head.

Next, part of the block 32 is machined away, removing the remaining continuity between the conductive plates 56 and the block 32. FIG. 9 shows the first such machine cut, in which the corner hole 46 is exposed and part of the moat 42, now filled with resin 62, is also exposed. After the cut shown in FIG. 9, the conductive plates 56 are still attached along one of their four edges to the block 32. They are also fully encased on three sides by resin 62. Further cuts are made and FIG. 10 shows a cut which exposes the outside edges 64 of the conductive plates 56, each separated by a layer of resin 62. The second end 48 of the block 32 is thus machined to expose the conductive plates 56 and machined into the shape of a semi-conductor chip (not shown) which the socket is designed to accept.

Figure 11:
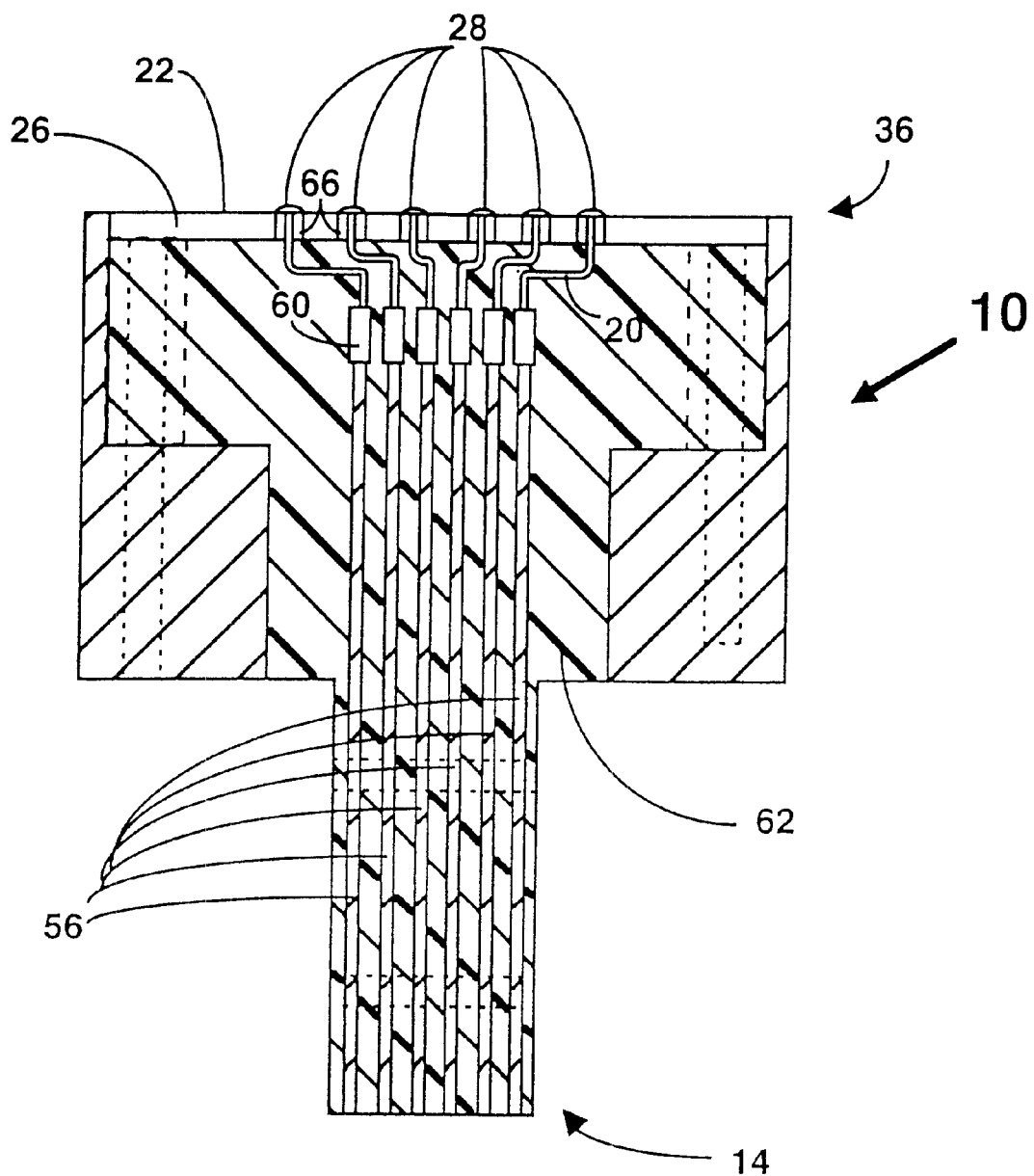
FIG. 11 is a side cross-sectional view of a socket test probe showing the edge view of the conductive plates.
Figure 12:
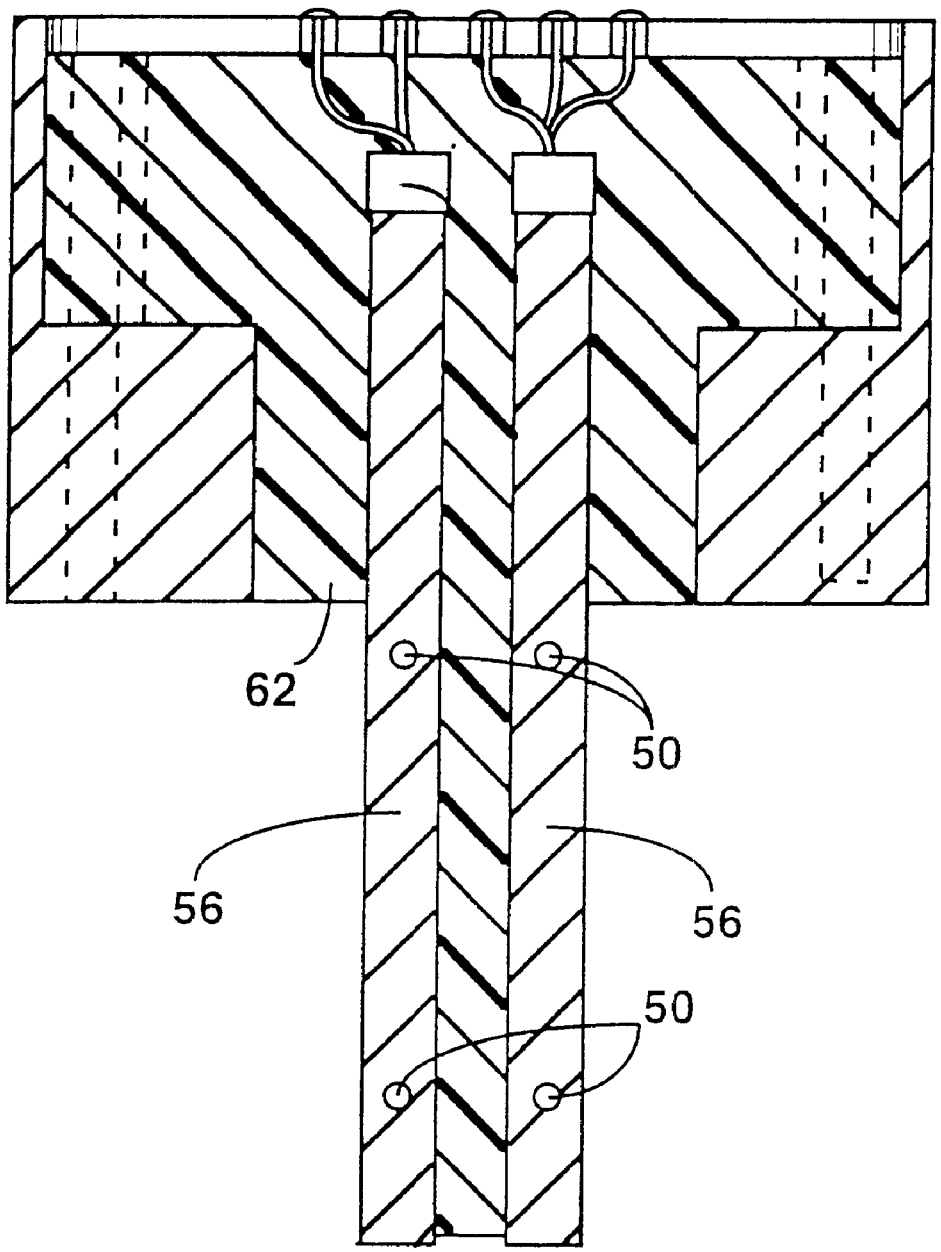
FIG. 12 is a side cross-sectional view of the socket test probe showing the sides of the conductive plates.

At FIG. 11 is a view of the socket test probe 10 after machining cuts have been made to expose the probe head 14. After machining is complete, a printed circuit board 26 is installed at the first end 36 of the block 32. In the printed circuit board 26, holes 66 are drilled and the electrical connections 20 are extended through the holes. The electrical connections 20 are soldered in place in the holes, forming solder knobs. FIG. 12 shows a cross-sectional view of the finished device parallel to the conductive plates 56.

Figure 13:
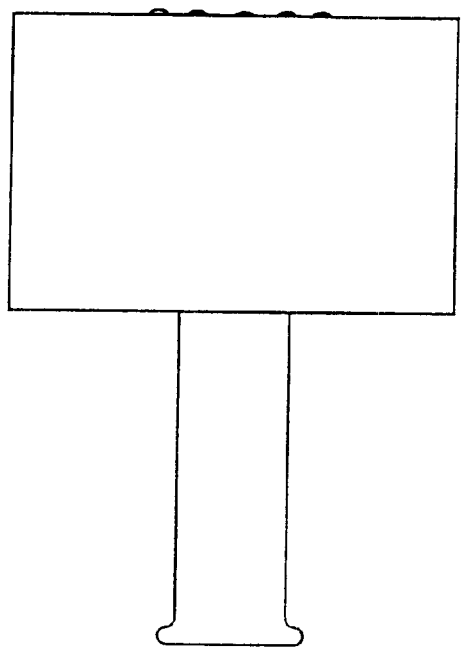
FIG. 13 is a side view of a test probe socket showing a gull wing configuration.
Figure 14:
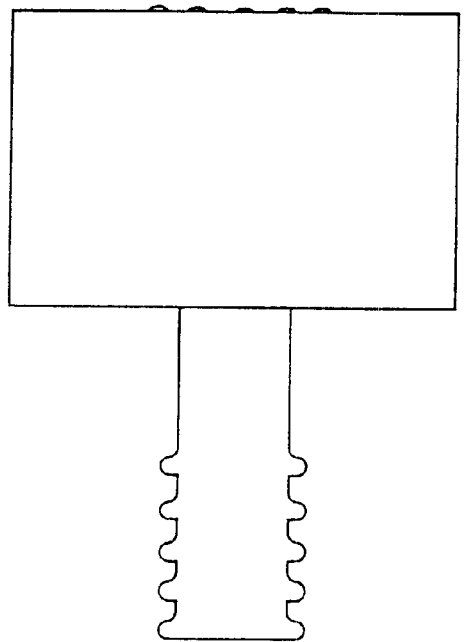
FIG. 14 is a side view of a socket test probe showing multiple gull wing projections.

The probe head 14 can be finished in different shapes to match the socket being simulated. These shapes can be of the rectangular shape shown in FIG. 1. It can also be what is known as a "gull wing" shape, as shown in FIG. 13. The "gull wing", or "live bug" shape is used for a chip whose electrodes are splayed outward from below. That same chip can be inverted to what is called a "dead bug" configuration, and the ridge or "rounded knob" on the probe head 14 would be in a slightly different configuration. The probe head 14 can have a bevel on the sides, to make entry into the socket smoother. The probe head 14 can also have multiple "gull wing" or "rounded knob" type protrusions on its sides, as shown in FIG. 14. The purpose of this is so that when the electrodes 58 are worn, the probe head 14 can be machined down to expose a new set of gull wing electrodes. A rectangular head can also be resurfaced in this manner.

While there is shown and described the present preferred embodiment of the invention, it is to be distinctly understood that this invention is not limited thereto but may be variously embodied to practice within the scope of the following claims.

We claim:

1. A method of making a socket test probe for use in a testing device, comprising the steps of:
    machining from a solid rectangular block of conductive metal a recess on one end of said block of metal which defines a moat around a rectangular tower of metal from the solid block of metal, and which leaves an outer rim of said end;
    drilling a hole through said block at said tower of metal in said block;
    using electro discharge machining to expand said drilled hole into a central channel with fluted side channels which define three sides of a number of metal plates, from said tower of metal and through said block of metal;
    filling said central channel and part of said recess including said moat with a liquid resin;
    allowing said resin to harden into a solid non-conductive material;

connecting electrical connectors to an end of each of said metal plates which protrude into said recess;

machining said block of metal in a pattern surrounding said central channel filled with hardened resin, and machining into said moat filled with resin, thereby isolating said metal plates from contact with said metal block from which they originated, and leaving said metal plates encased in resin, with an outside edge exposed to form electrodes, connected to said metal block by said resin in said moat, with an end of said block opposite said side with said recess forming a probe head; and connecting said electrical connectors to a probe interface, for communication with a matching interface of a testing device.

2. The method of claim 1 which further comprises a step of drilling one or more positioning holes or holes for positioning pins in said rim around said recess in said metal block which are configured to interconnect with corresponding positioning holes in or pins on a testing device designed to connect with said test probe.

3. The method of claim 1 which further comprises installing a printed circuit board in said recess to serve as said probe interface.

4. The method of claim 1 which further comprises connecting said electrical connections to said probe interface with solder knobs, which encase a second end of said electrical connection.

5. The method of claim 1 which further comprises machining said metal block so that the resulting conductive plates and resin layers further comprise a protrusion in said outer edge which makes the electrodes of said probe head similar in shape to semiconductor chips with flared electrodes.

6. The method of claim 1 which further comprises machining said metal block so that the resulting conductive plates further comprise multiple spaced apart protrusions in said outer edge, each protrusion configured to simulate a shape of a semiconductor chip with flared electrodes, so that said probe head can be cut off to expose new electrode surfaces when one electrode set becomes worn.

7. The method of claim 1 which further comprises machining an edge of the probe head to form a beveled edge.

8. The method of claim 1 which further comprises drilling a hole through said metal block in a position which will result in said hole being located in said conductive metal plates in said central channel, and when said channel is filled with resin, connects said conductive metal plates with a contiguous resin rod, for resisting delamination of said layers of conductive plates and said resin layers.

* * * * *